(12) United States Patent
Schmit

(10) Patent No.: US 9,629,262 B2
(45) Date of Patent: Apr. 18, 2017

(54) ELECTRONIC ASSEMBLY HAVING ALIGNABLE STACKED CIRCUIT BOARDS

(71) Applicant: Deere & Company, Moline, IL (US)

(72) Inventor: Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 14/738,198

(22) Filed: Jun. 12, 2015

(65) Prior Publication Data

US 2016/0366771 A1    Dec. 15, 2016

(51) Int. Cl.
H05K 5/00    (2006.01)
H05K 5/02    (2006.01)

(52) U.S. Cl.
CPC .......... *H05K 5/006* (2013.01); *H05K 5/0239* (2013.01)

(58) Field of Classification Search
CPC ............................ H05K 5/006; H05K 5/0239
USPC .......... 361/679.01, 735, 736, 748, 752, 760, 361/796, 797, 800
See application file for complete search history.

(56) References Cited

U.S. PATENT DOCUMENTS

| | | | |
|---|---|---|---|
| 4,313,150 A | 1/1982 | Chu | |
| 6,056,579 A | 5/2000 | Richards, III et al. | |
| 6,560,115 B1 * | 5/2003 | Wakabayashi | H05K 5/0065 174/541 |
| 6,795,317 B1 | 9/2004 | Liu | |
| 7,291,023 B1 | 11/2007 | Still et al. | |
| 8,665,601 B1 | 3/2014 | Mangay-Ayam, Jr. et al. | |
| 8,760,878 B2 | 6/2014 | Lostoski et al. | |
| 2003/0206392 A1 * | 11/2003 | Kawata | H05K 1/0203 361/631 |
| 2006/0114662 A1 | 6/2006 | Liu et al. | |
| 2006/0120057 A1 | 6/2006 | Apfelbacher et al. | |
| 2006/0232948 A1 * | 10/2006 | Haager | H05K 7/1417 361/752 |
| 2007/0230143 A1 * | 10/2007 | Inagaki | B60R 16/0239 361/752 |
| 2007/0236462 A1 | 10/2007 | Morris et al. | |

(Continued)

FOREIGN PATENT DOCUMENTS

| | | |
|---|---|---|
| DE | 102012203281 A1 | 9/2013 |
| EP | 0631149 A1 | 12/1994 |
| GB | 2298452 A | 9/1996 |

OTHER PUBLICATIONS

British Search Report in foreign counterpart application No. GB1610254.3 dated Nov. 28, 2016 (4 pages).

*Primary Examiner* — Courtney Smith
*Assistant Examiner* — Sagar Shrestha

(57) ABSTRACT

A frame is secured to a first circuit board by provisions and respective fasteners to form a first circuit board assembly. A second circuit board has a second connector portion for mating with the first connector portion of the first circuit board. A holder overlies the second circuit board. The holder has a recess with an opening for the second connector portion to extend through. A clearance gap between the interior perimeter of the recess and the outer perimeter of the circuit board assembly allows alignment or registration of the first connector portion and the second connector portion. A lid is connected to the holder via one or more fasteners to secure the first circuit board assembly with respect to the second circuit board.

17 Claims, 7 Drawing Sheets

(56) References Cited

U.S. PATENT DOCUMENTS

| | | | | |
|---|---|---|---|---|
| 2008/0294324 A1* | 11/2008 | Yoshinari | ............... | F02D 41/20 |
| | | | | 701/102 |
| 2012/0250279 A1* | 10/2012 | Harashima | ............. | G06F 1/187 |
| | | | | 361/760 |
| 2013/0119908 A1* | 5/2013 | Harada | .................... | H02P 6/10 |
| | | | | 318/400.42 |
| 2013/0277820 A1* | 10/2013 | Hotta | ................. | H01L 23/4006 |
| | | | | 257/712 |
| 2013/0329356 A1* | 12/2013 | Shanbhogue | ......... | H05K 1/144 |
| | | | | 361/679.47 |
| 2015/0274197 A1* | 10/2015 | Saito | ................... | B62D 5/0406 |
| | | | | 318/400.29 |
| 2015/0303596 A1* | 10/2015 | Nagai | .................. | H01R 12/58 |
| | | | | 439/75 |

* cited by examiner

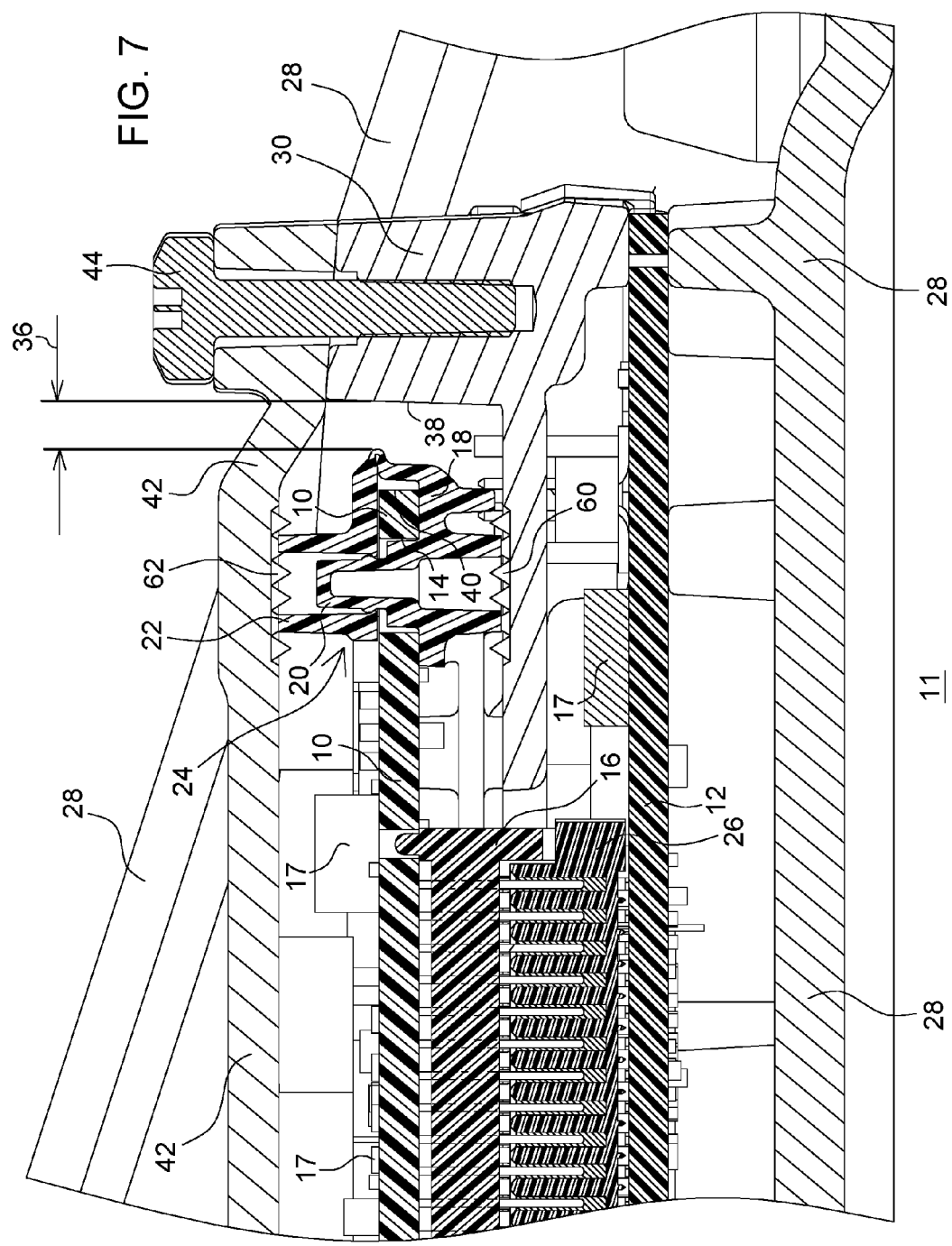

ELECTRONIC ASSEMBLY HAVING ALIGNABLE STACKED CIRCUIT BOARDS

FIELD OF DISCLOSURE

This disclosure relates to an electronic assembly having alignable stacked circuit boards.

BACKGROUND

In certain prior art, circuit boards can be stacked to utilize efficiently space within enclosures. Technical problems can arise in making electrical connections between the circuit boards via connectors because of tolerances of manufacturing processes. For example, the use of custom fixtures or jigs to attain desired tolerances can make manufacturing processes more costly and difficult to shift production between different electronic products on a production line. Sometimes, attempts to align connectors, between stacked circuit boards, result in manufacturing yield reduction or scrap during the soldering process when connectors are positioned outside of the desired tolerance. Other times, during assembly attempts to align connectors, between stacked circuit boards, can result in mechanical stress and the potential for later failures of solder joints associated with the connectors in an effort to force the mating of the connectors. Thus, there is need for an electronic assembly having alignable, stacked circuit boards.

SUMMARY

In accordance with one embodiment, an electronic assembly comprises a first circuit board and a second circuit board that are stacked with respect to each other. The first circuit board has a plurality of holes and a first connector portion mounted on or extending from one side of the first circuit board. A frame has provisions (e.g., studs or openings) for mating with the holes. The frame is secured to the first circuit board by the provisions and respective fasteners to form a first circuit board assembly. The second circuit board has a second connector portion for mating with the first connector portion to form an electrical and mechanical connection. A first enclosure portion retains or holds the second circuit board. A holder overlies the second circuit board. The holder has a recess with an opening for the second connector portion to extend through. The first circuit board assembly is alignably positioned in the recess. A clearance gap between the interior perimeter of the recess and the outer perimeter of the circuit board assembly allows alignment or registration of the first connector portion and the second connector portion. A lid is connected to the holder via one or more fasteners to secure the first circuit board assembly with respect to the second circuit board (and the first enclosure portion).

BRIEF DESCRIPTION OF THE DRAWINGS

FIG. 7 is a cross-sectional view of the fully assembled electronic enclosure along reference line 7-7 of FIG. 6.

BRIEF DESCRIPTION OF EMBODIMENT(S)

Figure 6:
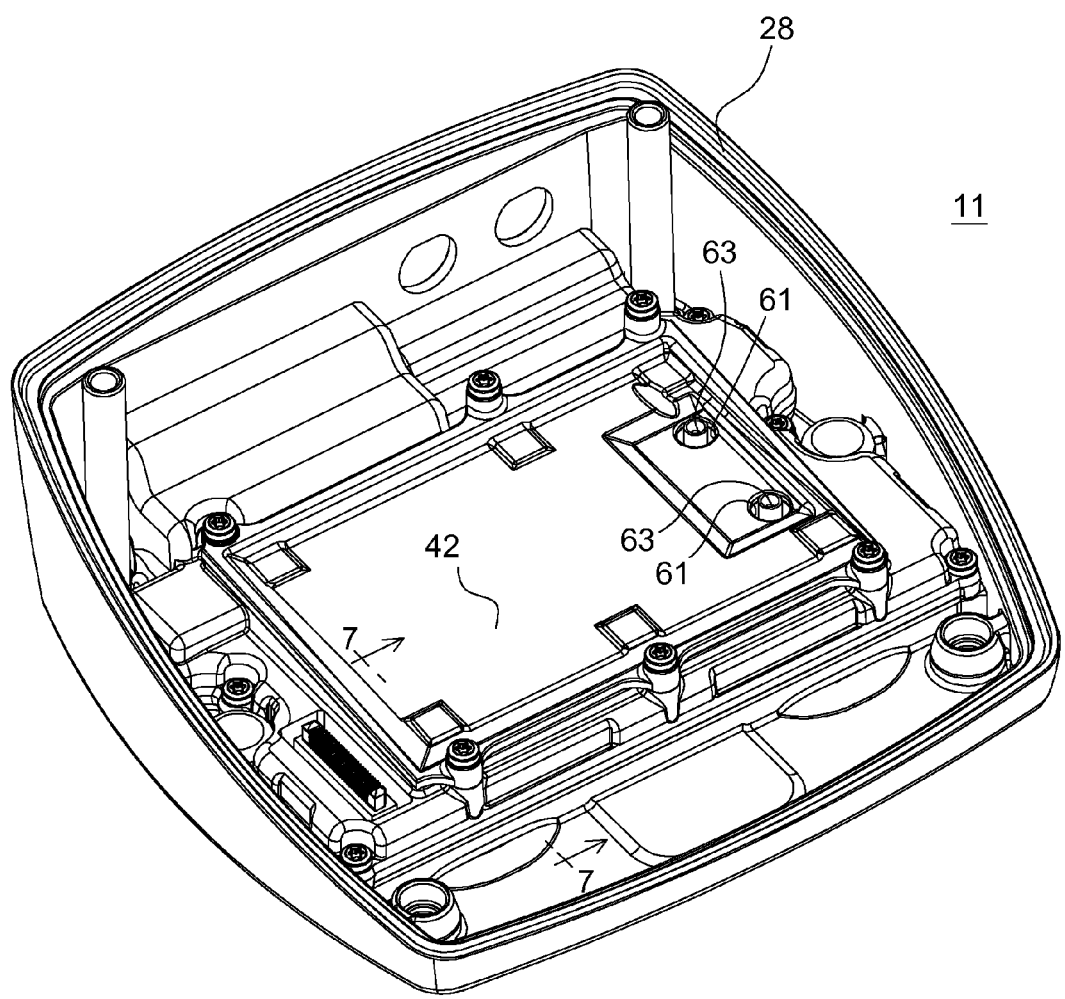
FIG. 6 is a perspective view of the electronic assembly similar to that of FIG. 4.

In accordance with one embodiment, FIG. 6 and FIG. 7 illustrate an electronic assembly 11 that comprises a first circuit board 10 and a second circuit board 12 that are stacked with respect to each other. For example, FIG. 7 illustrates a cross section of the stacked circuit boards (10, 12).

Figure 1:
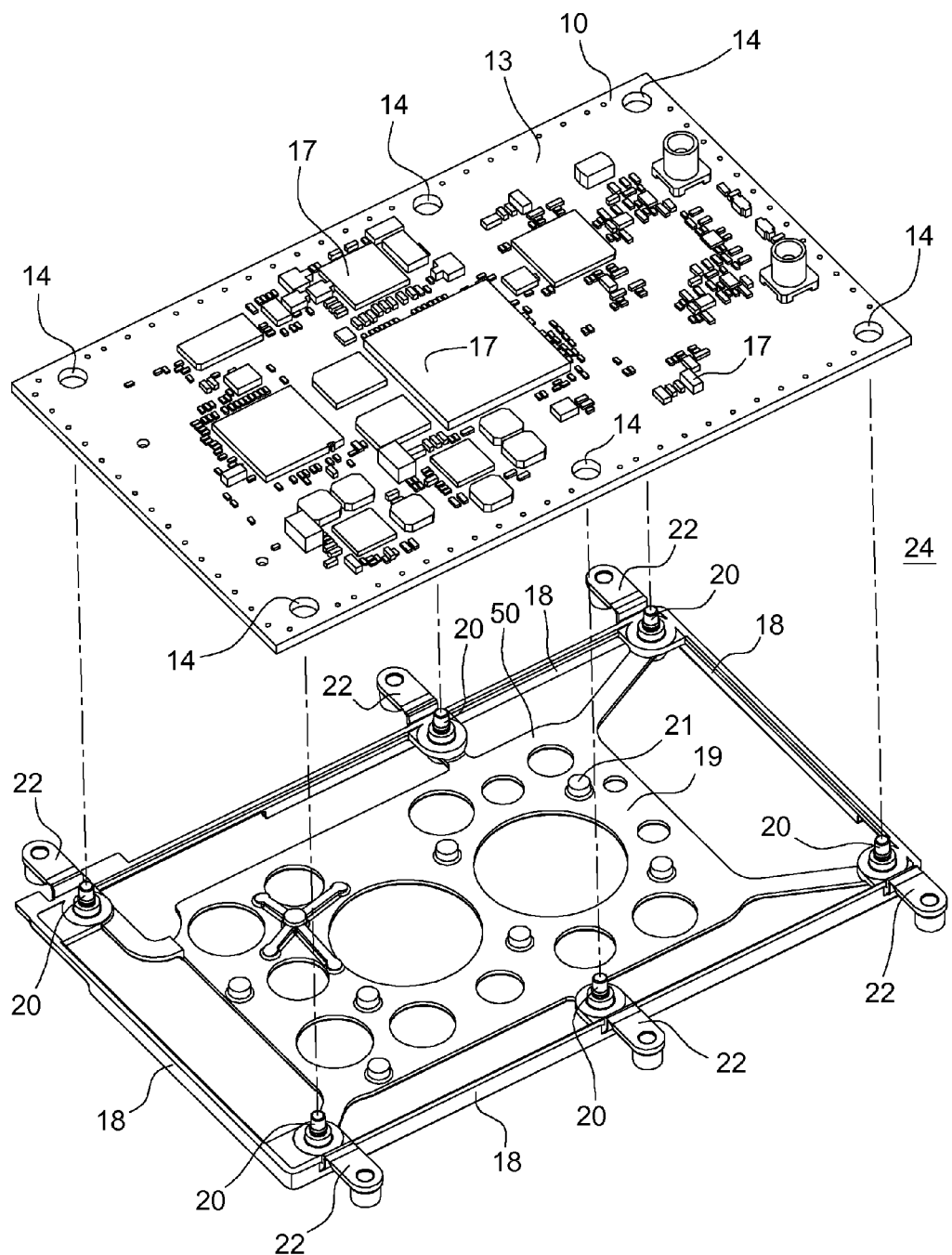
FIG. 1 is an exploded perspective view of the first circuit board assembly.

As illustrated in FIG. 1, the first circuit board 10 has a plurality of holes 14 and a first connector portion 16 mounted on or extending from one side 15 (e.g., lower side) of the first circuit board 10. For example, a first circuit board 10 has a plurality of holes 14 around a perimeter of the first circuit board 10 in alignment with the attachment provisions 20 of the frame 18. For example, the attachment provisions 20 may comprise studs, pins, pins that terminate in threaded studs, snap-fit connectors, or apertures for receiving respective fasteners. The first circuit board 10 has a plurality of components 17, such as electronic components, electromechanical components, or electrical components mounted on one or both sides (13, 15) of the first circuit board 10. For example, electronic components may comprise resistors, capacitors, semiconductors, or integrated circuits. Electrical or electromechanical components can include connectors, radio frequency shielding, and heat sinks. In one illustrative configuration, the first circuit board 10 may comprise a dielectric layer and one or more electrically conductive traces that overlie the dielectric layer.

Figure 2:
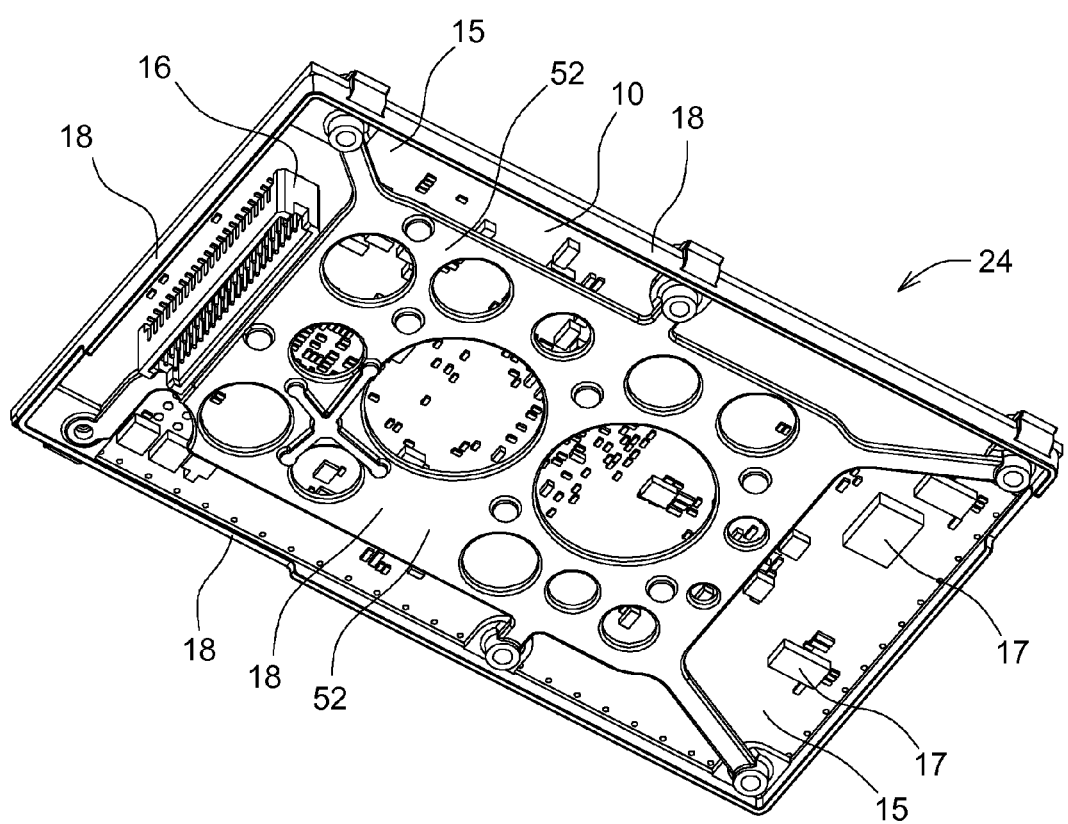
FIG. 2 is a perspective view of the first circuit board assembly viewed from a bottom side to reveal the first connector portion.
Figure 4:
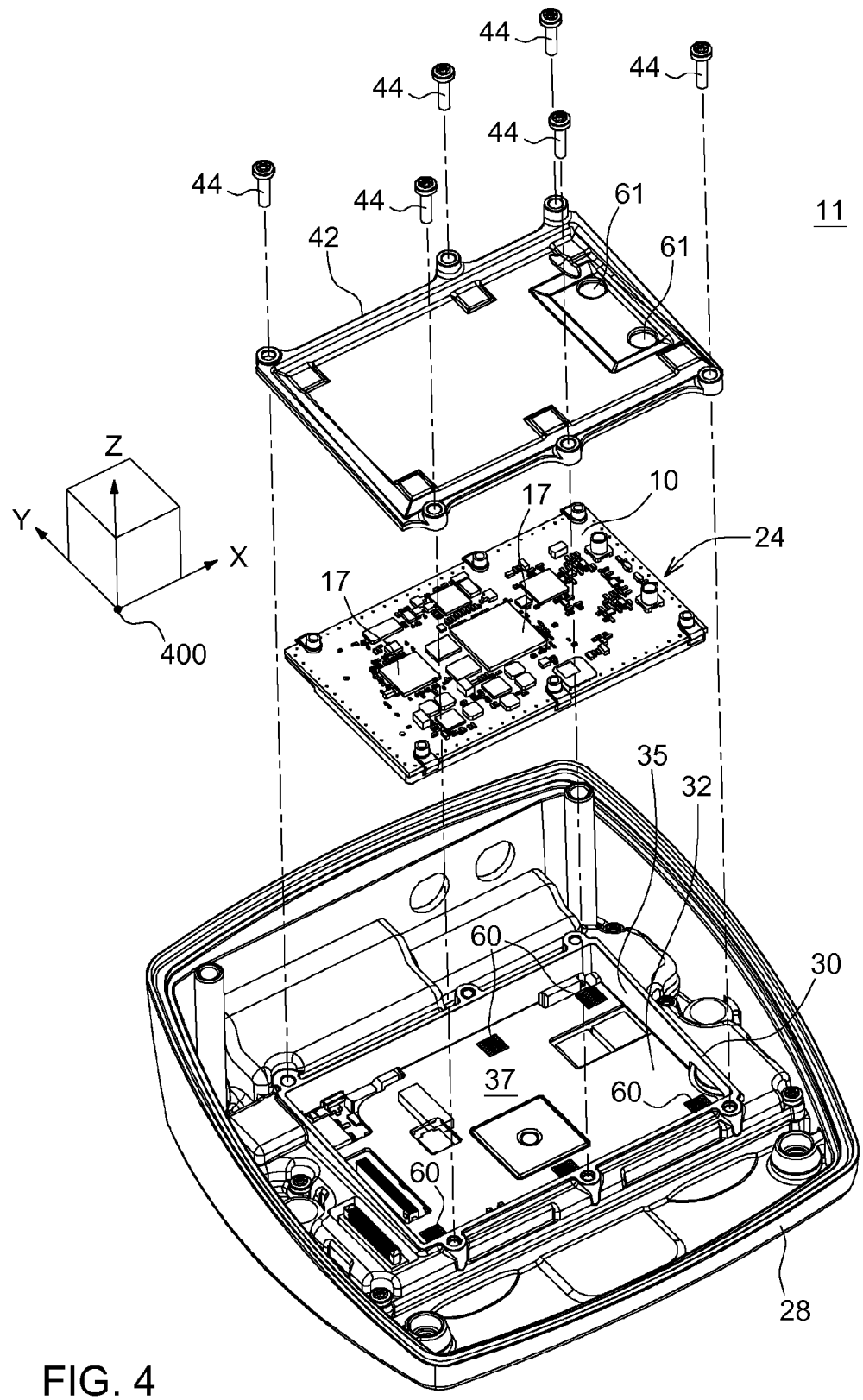
FIG. 4 is an exploded perspective view of the second circuit board assembly and first enclosure portion, the first circuit board assembly, and the lid.

In one embodiment, as shown in FIG. 1, a frame 18 has provisions 20 for mating with, receiving, interlocking with, or engaging the holes 14. The frame 18 may have one or more central portions 19 with spacers 21 (e.g., dielectric spacers) one a first side 50 to support the first circuit board 10 above an interior surface or a recess 32 in a holder 30. Meanwhile, a second side 52 of the frame 18 is opposite the first side 50; the second side 52 may be generally planar to slidably move with respect to the interior surface or recess 32 of the holder 30. As shown in FIG. 2 and FIG. 4, frame 18 is secured to the first circuit board 10 by the provisions 20 and respective fasteners 22 to form a first circuit board assembly 24. The frame 18 is or can be composed of a dielectric material. For example, as illustrated in FIG. 1, the frame 18 comprises fasteners 22 that are movably or pivotably hinged to the frame 18, and wherein the fasteners 22 are folded into position to engage the corresponding provisions 20.

In an alternate embodiment, the fasteners 22 may be separate from the frame 18, such as separate clips, retainers, nuts, bolts, screws, rivets or other fasteners 22.

Figure 3:
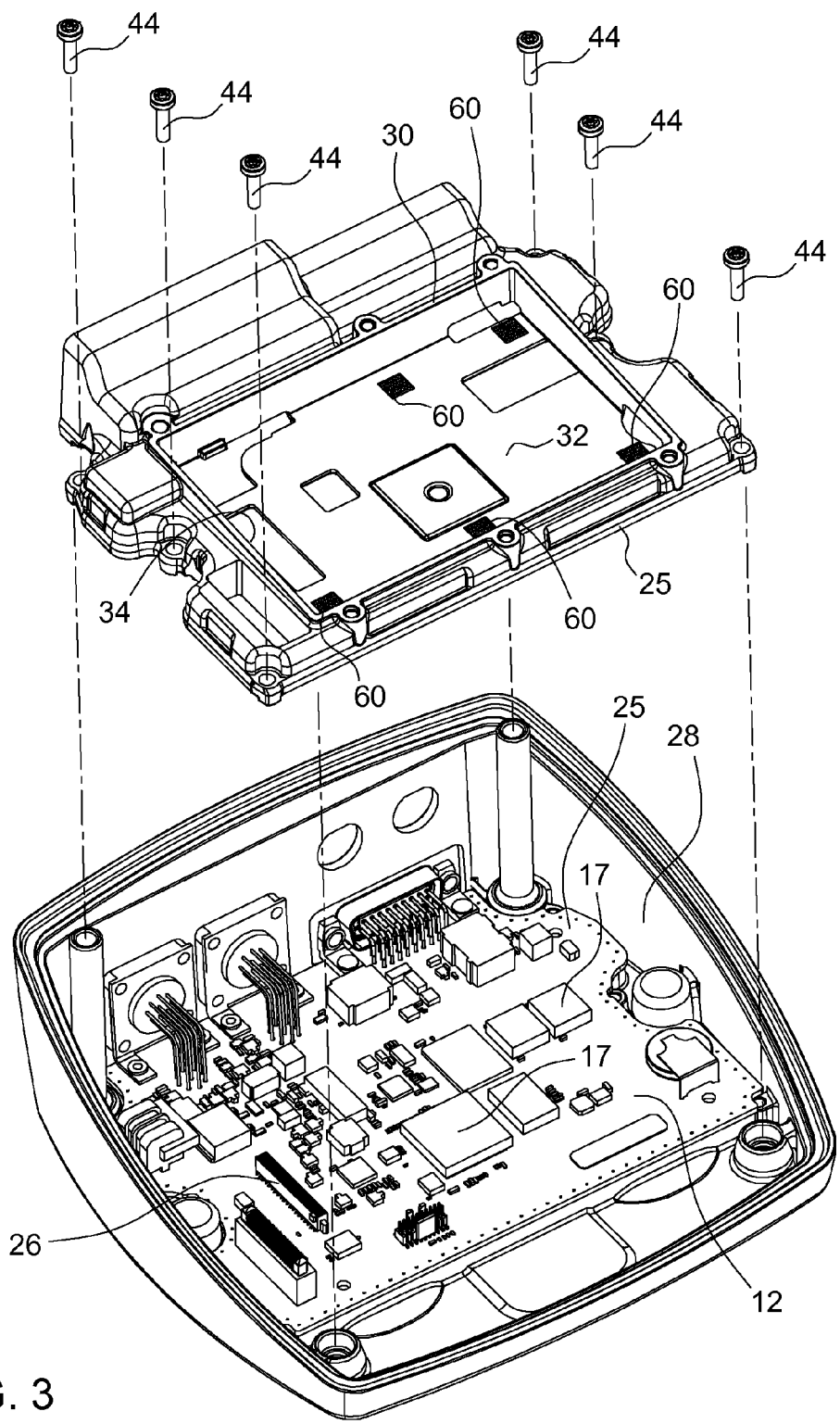
FIG. 3 is an exploded perspective view of a second circuit board assembly comprising a second circuit board and the holder, where the second circuit board has the second connector portion and where the second circuit board assembly is mounted in a first enclosure portion.

In FIG. 3, the second circuit board 12 has a second connector portion 26 for mating with the first connector portion 16 to form an electrical and mechanical connection. A first enclosure portion 28 retains the second circuit board 12. For example, the second circuit board 12 can be connected to the first enclosure portion 28 via one or more fasteners. The second circuit board 12 has a plurality of components 17, such as electronic components, electromechanical components, or electrical components mounted on one or both sides of the second circuit board 12. For example, electronic components may comprise resistors, capacitors, semiconductors, or integrated circuits. Electrical or electromechanical components can include connectors, radio frequency shielding, and heat sinks. In one illustrative configuration, the second circuit board 12 may comprise a dielectric layer and one or more electrically conductive traces that overlie the dielectric layer.

A second enclosure portion (not shown) mates with the first enclosure portion 28. An intervening seal between the first enclosure portion 28 and the second enclosure portion may prevent the ingress of moisture, fog, salt, debris or contaminants into the interior of the housing. Collectively, the first enclosure portion 28 and the second enclosure portion form an housing or enclosure (e.g., dielectric housing) for housing the first circuit board 10 and the second circuit board 12. The housing or enclosure may be molded from plastic, a polymer, a plastic composite, a polymer composite, or a plastic, polymer or composite reinforced with a fiber or suitable filler.

In one embodiment, as illustrated in FIG. 3 a holder 30 overlies the second circuit board 12. The holder 30 is or can be composed of a dielectric material. The holder 30 (e.g., tray) has a recess 32 (e.g., substantially rectangular recess) with an opening 34 for the second connector portion 26 to extend through. The first circuit board assembly 24 is alignably positioned in the recess 32. A clearance gap 36 (e.g., perimeter clearance gap or spatial adjustment gap) between the interior perimeter 38 of the recess 32 and the outer perimeter 40 (or edge) of the circuit board assembly allows alignment or registration of the first connector portion 16 and the second connector portion 26. As limited or bounded by the clearance gap 36 during an adjustment mode, the first circuit board 10 can move in any direction (e.g., x direction, y direction, or both) in the x-y plane (e.g., substantially horizontal plane) defined in accordance with the reference coordinate system 400 of the x axis, y axis and z axis of FIG. 4.

FIG. 4 shows an exploded perspective view of a first circuit board 10 above a second circuit board 12 (FIG. 7) that is obscured beneath a holder 30. In one embodiment, as illustrated in FIG. 4 and FIG. 7, a lid 42 is connected to the holder 30 via one or more fasteners 44 to secure the first circuit board assembly 24 with respect to the second circuit board 12 and the first enclosure portion 28. The holder 30 has walls 35 and an interior surface 37. The first board assembly 24 can slidably contact the interior surface 37 (e.g., substantially planar interior surface) in an alignment mode in which the first connector portion 16 is adjustable, movable and aligned to the second connector portion 26, but is rigidly held into place in the fixed mode when the lid 42 is attached. The lid 42 may have openings 61 (FIG. 5) for one or more connectors 63, wiring harness, cables, wires or transmission lines that protrude from the first circuit board 10.

In one embodiment, the lid 42 is connected to the holder 30 to secure the first circuit board assembly 24 with respect to the second circuit board 12, or with respect to the second circuit board 12 and the first enclosure portion 28. As shown in FIG. 4, the holder 30 or its recess 32 has a plurality of first gripping members 60 to engage the first circuit board assembly 24 or the frame 18. When the lid 42 is connected to the holder 30 by one or more fasteners 44, the first gripping members 60 are compressed (e.g., elastically, resiliently, deformably, or non-deformably compressed) or pressed against the first circuit board 10 (or the first circuit board assembly 24) to secure the first circuit board assembly 24 with respect to the second circuit board 12, or with respect to the second circuit board 12 and the first enclosure portion 28.

In one embodiment, at least one of the first gripping members 60 comprises a resilient member or an elastomer. As illustrated in FIG. 4 and FIG. 7, at least one of first gripping members 60 has a region with projections, teeth, or a knurled surface for gripping the first circuit board assembly 24. Each first gripping member 60 may be integral with the holder 30 or a separate body that is bonded, attached or secured to the holder 30.

In one embodiment, the lid 42 has a plurality of second gripping members 62 to engage the first circuit board assembly 24. For example, the second gripping members 62 may be located on a lower side or interior side 41 of the lid 42. When the lid 42 is connected to the holder 30 by one or more fasteners 44, the second gripping members 62 are compressed (e.g., elastically, resiliently, deformably, or non-deformably compressed) or pressed against the first circuit board 10 (or the first circuit board assembly 24) to secure the first circuit board assembly 24 with respect to the second circuit board 12, or with respect to the second circuit board 12 and the first enclosure portion 28.

Figure 5:
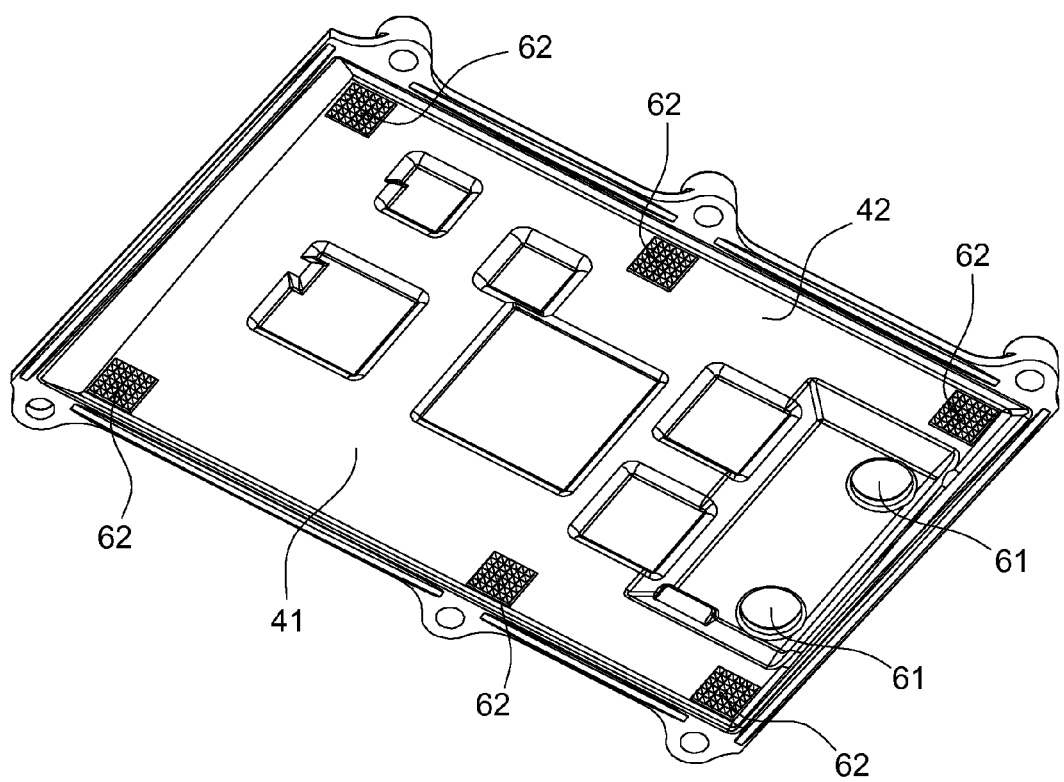
FIG. 5 is a perspective view of an interior side or lower side of the lid.

In one embodiment, at least one of the second gripping members 62 comprises a resilient member or an elastomer. As illustrated in FIG. 5 and FIG. 7, at least one of the second gripping members 62 has a region with projections, teeth, or a knurled surface for gripping the first circuit board assembly 24. Each second gripping member 62 may be integral with the lid 42 or a separate body that is bonded, attached or secured to the lid 42.

In certain embodiments, the holder 30 or its recess 32 has a plurality of first gripping members 60 to engage a first side 15 of first circuit board assembly 24 or the frame 18 and wherein the lid 42 has a plurality of second gripping members 62 to engage a second side 13 of the first circuit board assembly 24, where the second side 13 is opposite the first side 15. Accordingly, the first gripping members 60 and second gripping members 62 are compressed by the lid 42 or urged against the first circuit board assembly 24 when the lid 42 is connected to holder 30 whereby the first circuit board assembly 24 is secured and retained from movement in three dimensions (x, y and z axes or coordinate system 400) with respect to the second circuit board 12 and the first enclosure portion 28.

In an alternate embodiment, an interior side 41 of the lid 42, a recess 32 of the holder 30, or both have one or more teeth regions or regions of pointed projections (e.g., first gripping members 60 and second gripping members 62). For example, the pointed projections may comprise substantially pyramidal projections, jagged projections, teeth, or knurling features that can bite into, grab, grip, anchor, claw or form slight depressions in a mating or facing surface of the first circuit board 10 or the first circuit board assembly 24. The regions of pointed projections bite into a mating or facing surface of the first circuit board 10 or the first circuit board assembly 24 to restrict or prevent any movement of the first circuit board 10 with respect to the second circuit board 12, or second circuit board assembly 25. For example, all three moments of freedom or three dimensional displacement (e.g., along the x, y or z axes of the reference coordinate system 400) of the first circuit board 10 with respect to the second circuit board 12 become fixed as one or more regions of pointed projects (e.g., the flat knurling feature) has bitten into the frame 18 of the first circuit board 10, mating surfaces (e.g., designated mating surfaces) of the first circuit board 10, or both.

In another alternate embodiment, any of the gripping members (60, 62) may be replaced by or used in conjunction with an adhesive for adhesively bonding the first circuit board 10 (or the first circuit board assembly 24) to the holder 30 and the lid 42 to prevent relative movement of the first circuit board 10 with respect to the second circuit board 12.

In one configuration, the first connector portion 16 and the second connector portion 26 comprise surface mount connectors or other connectors that are soldered to conductive traces on the first circuit board 10 and the second circuit board 12. A first board can be stacked with respect to a second circuit board 12, such that the first circuit board 10 overlies or is secured over the second circuit board 12 while allowing the first connector portion 16 and the second connector portion 26 to mate because the circuit boards in an alignment mode where the first circuit board 10 has the freedom to float or move to achieve a strain-free connection between the first connector portion 16 and the second connector portion 26. Upon mating of the first connector portion 16 and the second connector portion 26, the first connector portion 16 and the second connector portion 26 may be referred to as a connector.

The connector (16 and 26, collectively) determines a position that the boards should align to one another in the alignment mode for uniting fully the first connector portion 16 and the second connector portion 26 to minimize lateral mechanical stress (e.g., in the x-y plane defined by the x-y axes of the reference coordinate system 400) on one or more solder joints between first circuit board 10 and the first connector portion 16. The final mounting position of the first circuit board 10 relative to the second circuit board 12 is, in essence, designated by fixed spatial placement (e.g., soldered position or mounted position) of the connector (16, 26) on the circuit boards (10, 12). During the alignment mode or during assembly of the electronic assembly 11, the first circuit board 10 is moved in the recess 32 (with the clearance gap 36) to the aligned or registered position that the connector (16, 26) requires for mating to minimize lateral mechanical stress on the connector (16, 26) and its or their respective solder joints in the x-y plane defined by the x-y axis of coordinate system 400. After the alignment is achieved in the alignment mode, a securing cover or lid 42 is placed over the first circuit board 10 with gripping members 60 or other retainer members to lock, to compress, to clamp or to fix the alignment in place in a fixed mode. The lid 42 secures the first circuit board 10 with respect to the second circuit board 12 in alignment or registration and prevents relative movement in three dimensions or the associated six degrees of freedom in the fixed mode.

Having described the preferred embodiment, it will become apparent that various modifications can be made without departing from the scope of the invention as defined in the accompanying claims.

The invention claimed is:

1. An electronic assembly comprising:
   a first circuit board having a plurality of holes and a first connector portion mounted on one side of the first circuit board;
   a frame for having provisions for mating with the holes, the frame being secured to the first circuit board by the provisions and fasteners to form a first circuit board assembly;
   a second circuit board having a second connector portion for mating with the first connector portion to form an electrical and mechanical connection;
   a first enclosure portion retaining the second circuit board;
   a holder overlying the second circuit board, the holder having a recess with an opening for the second connector portion to extend through; the first circuit board assembly in the recess; a clearance gap between the interior perimeter of the recess and the outer perimeter of the circuit board assembly allowing alignment or registration of the first connector portion and the second connector portion; and
   a lid connected to the holder via one or more fasteners to secure the first circuit board assembly with respect to the second circuit board and the first enclosure portion, wherein the frame comprises fasteners that are movably or pivotably hinged to the frame, and wherein the fasteners are folded into position to engage the corresponding provisions that comprise studs.

2. The electronic assembly according to claim 1 wherein the holder or its recess has a plurality of first gripping members to engage the first circuit board assembly or the frame.

3. The electronic assembly according to claim 2 wherein the first gripping members are compressed by the lid against the first circuit board assembly when the lid is connected to the holder to secure the first circuit board assembly with respect to the second circuit board and the first enclosure portion.

4. The electronic assembly according to claim 2 wherein at least one of the first gripping members comprises a resilient member or an elastomer.

5. The electronic assembly according to claim 2 wherein at least one of first gripping members has teeth or a knurled surface for gripping the first circuit board assembly.

6. The electronic assembly according to claim 1 wherein the lid has a plurality of second gripping members to engage the first circuit board assembly.

7. The electronic assembly according to claim 6 wherein the second gripping members are compressed by the lid against the first circuit board assembly when the lid is connected to the holder to secure the first circuit board assembly with respect to the second circuit board and the first enclosure portion.

8. The electronic assembly according to claim 6 wherein at least one of the second gripping members comprises a resilient member or an elastomer.

9. The electronic assembly according to claim 6 wherein at least one of the second gripping members has teeth or a knurled surface for gripping the first circuit board assembly.

10. The electronic assembly according to claim 1 wherein the holder or its recess has a plurality of first gripping members to engage a first side of first circuit board assembly or the frame and wherein the lid has a plurality of second gripping members to engage a second side of the first circuit board assembly, the second side opposite the first side.

11. The electronic assembly according to claim 1 further comprising a plurality of resilient gripping members that are elastically, resiliently or non-deformably compressed by the lid when the lid is connected to holder whereby the first circuit board assembly is secured and retained from movement in three dimensions with respect to the second circuit board and the first enclosure portion.

12. The electronic assembly according to claim 1 wherein the frame is composed of a dielectric material.

13. The electronic assembly according to claim 1 wherein the first connector portion and the second connector portion comprise surface mount connectors or other connectors that are soldered to conductive traces on the first circuit board and the second circuit board.

14. The electronic assembly according to claim 1 wherein the provisions comprise studs and the holes are disposed around a perimeter of the circuit board in alignment with the provisions of the frame.

15. The electronic assembly according to claim 1 wherein an interior of the lid, a recess of the holder, or both have gripping members.

16. The electronic assembly according to claim 1 wherein an interior of the lid, a recess of the holder, or both have one or more teeth regions or regions of pointed projections.

17. The electronic assembly according to claim 16 wherein the regions of pointed projections bite into a mating or facing surface of the first circuit board or the first circuit board assembly to restrict or prevent any movement of the first circuit board with respect to the second circuit board.

\* \* \* \* \*